United States Patent
Thaler et al.

(10) Patent No.: US 9,544,091 B2
(45) Date of Patent: Jan. 10, 2017

(54) BANDWIDTH CONTROL FOR DIFFERENTIAL MANCHESTER ENCODING AUTO-NEGOTIATION SIGNALING

(71) Applicant: Broadcom Corporation, Irvine, CA (US)

(72) Inventors: Patricia Ann Thaler, Carmichael, CA (US); Maurice David Caldwell, Robbinsville, NJ (US); Gregory Lee Silvus, Boulder, CO (US)

(73) Assignee: Broadcom Corporation, Irvine, CA (US)

( * ) Notice: Subject to any disclaimer, the term of this patent is extended or adjusted under 35 U.S.C. 154(b) by 60 days.

(21) Appl. No.: 14/707,547

(22) Filed: May 8, 2015

(65) Prior Publication Data

US 2015/0326342 A1     Nov. 12, 2015

Related U.S. Application Data

(60) Provisional application No. 61/991,412, filed on May 9, 2014.

(51) Int. Cl.
*H04L 1/00* (2006.01)
*H04L 1/24* (2006.01)
*H03M 13/09* (2006.01)

(52) U.S. Cl.
CPC ........... *H04L 1/0061* (2013.01); *H04L 1/0023* (2013.01); *H04L 1/24* (2013.01); *H03M 13/09* (2013.01)

(58) Field of Classification Search
None
See application file for complete search history.

(56) References Cited

U.S. PATENT DOCUMENTS

| | | | | |
|---|---|---|---|---|
| 5,696,800 A * | 12/1997 | Berger | ...................... | H04L 7/02 341/70 |
| 6,285,659 B1 * | 9/2001 | Feuerstraeter | ........ | H04L 1/0002 370/244 |
| 6,349,331 B1 * | 2/2002 | Andra | ............... | H04L 12/40032 709/220 |

(Continued)

OTHER PUBLICATIONS

IEEE Standard for Ethernet, Clause 73, Auto-Negotiation for backplane and copper cable assembly, 2012, pp. 503-538, Institute of Electrical and Electronics Engineers, New York, NY.

(Continued)

*Primary Examiner* — Brian Roberts
(74) *Attorney, Agent, or Firm* — Brinks Gilson & Lione

(57) ABSTRACT

A network device includes a communication interface and a transmitter coupled to the communication interface. The transmitter is configured to determine to start an auto-negotiation page with a link partner, and transmit, through the communication interface, a start delimiter for the auto-negotiation page. The transmitter transmits the start delimiter by transmitting a first pulse comprising a first encoding violation, followed by a second pulse comprising a second encoding violation. The transmitter may shorten the first pulse and the second pulse relative to a different pre-defined start delimiter to define spectral content for the first pulse and the second pulse that passes different first and second receiver filters in the link partner for different first and second communication standards.

20 Claims, 8 Drawing Sheets

(56) References Cited

U.S. PATENT DOCUMENTS

| | | | | |
|---|---|---|---|---|
| 7,023,873 B2* | 4/2006 | Gibson | ............ | H04B 10/0799 |
| | | | | 370/445 |
| 7,054,947 B2* | 5/2006 | Yun | ........................ | H04L 29/06 |
| | | | | 370/348 |
| 7,447,168 B2* | 11/2008 | Thaler | .................. | H04L 5/1438 |
| | | | | 370/296 |

OTHER PUBLICATIONS

Liu, Zhenyu, PAM 3 Mapping for 802.3bp, Mar. 2014, pp. 1-12, IEEE P802.3bp RTPGE Task Force, Beijing, China.
Lo, William, Auto-Negotiation—What is it and how it fits into 1TPCE, May 2014, pp. 1-21, IEEE 1TPCE—Study Group Meeting, Institute of Electrical and Electronics Engineers, New York, NY.

* cited by examiner

BANDWIDTH CONTROL FOR DIFFERENTIAL MANCHESTER ENCODING AUTO-NEGOTIATION SIGNALING

PRIORITY CLAIM

This application claims priority to provisional application Ser. No. 61/991,412, filed 9 May 2014, which is entirely incorporated by reference.

TECHNICAL FIELD

This disclosure relates to auto-negotiation in communication networks. This disclosure also relates to bandwidth control of auto-negotiation signaling in Ethernet networks.

BACKGROUND

High speed data networks form part of the backbone of what has become indispensable worldwide data connectivity. Within the data networks, network devices such as network switches direct data packets from source ports to destination ports of link partners, helping to eventually guide the data packets from a source to a destination. Improvements in link communications, and particularly improvements in the auto-negotiation process between link partners, will enhance the capability of network devices.

DETAILED DESCRIPTION

Figure 1:
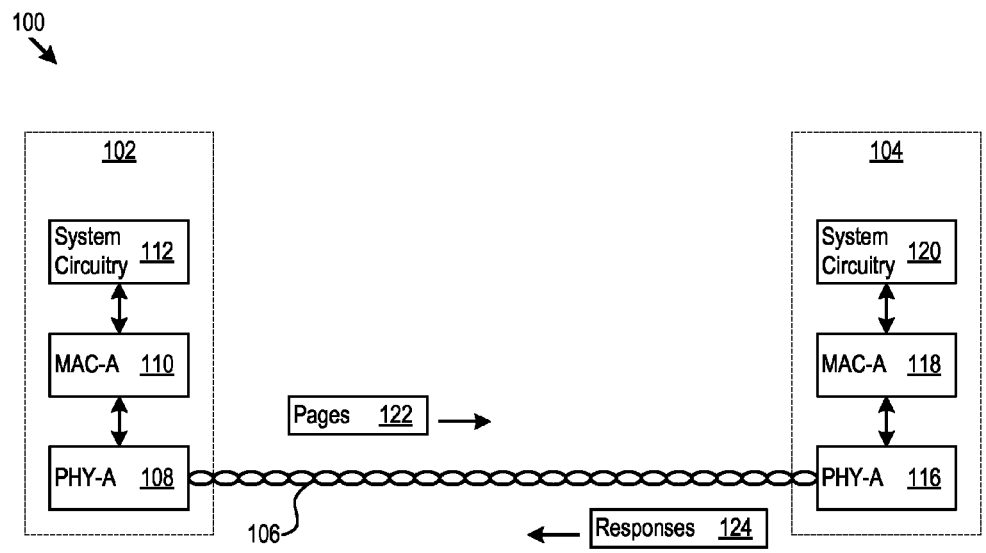
FIG. 1 shows an example of two link partners in communication.

FIG. 1 shows an example communication system 100 in which two link partners, a first device 102 and a second device 104, communicate over a communication link 106. There may be any number of link partners and the link partners may take virtually any form, including as just a few examples: switches, bridges, hubs, servers, client, wireless access point, routers, peripheral devices (e.g., video cameras, voice-over-IP phones, or printers), tablet, laptop, or desktop computers, or any other communication device. The link partners may communicate according to virtually any communications protocol, including any particular variation of Ethernet, IEEE 802.3, including IEEE 802.bp and other variations.

FIG. 1 shows an example implementation of the first device 102, including parts of its communication stack. A physical layer (PHY) 108 is part of a transceiver that connects the first device 102 to the communication link 106. The PHY 108 may be a wireline, optical, or wireless interface. Accordingly, as examples, communication link 106 may be implemented as twisted pair cable, backplanes, fiber optic cables, or any other media. In one particular implementation described below, the communication link 106 is a single twisted pair of wires, and the link partners take turns transmitting and receiving over the communication link 106.

The first device 102 also includes media access control (MAC) circuitry 110 that accepts data from the system circuitry 112 for transmission over the communication link 106. The MAC 110 also receives data for delivery to the system circuitry 112 after reception over the communication link 106. The system circuitry 112 may represent any data source or data sink, including hardware, software (e.g., application programs), or a combination of both. The second device 104 may also include a transceiver PHY 116, MAC circuitry 118, and system circuitry 120.

Each device 102, 104 may be a link partner with any other device, and may have different communication capabilities. To address this, the devices 102, 104 may execute an auto-negotiation process by which each device 102, 104 learns the capabilities of the other device. During auto-negotiation, each device 102, 104 may exchange information about the capabilities that the link partner supports. Given this information, the link partners select a common set of capabilities for their communications, typically the highest common denominator set of shared capabilities. The device 102, 104 exchange capabilities in pages 122 (e.g., 16 bit pages or 48 bit pages), which are acknowledged with responses 124.

The capabilities vary widely. As a few examples, the devices 102, 104 may be configured to be able to communicate according to one or more different communication standards. The standards include 10BaseT, 100BaseTX, 100BaseT1, and 1000BaseT1, which, among other aspects, determine link speed. As other examples, the capabilities may include full or half duplex communication capabilities.

Figure 2:
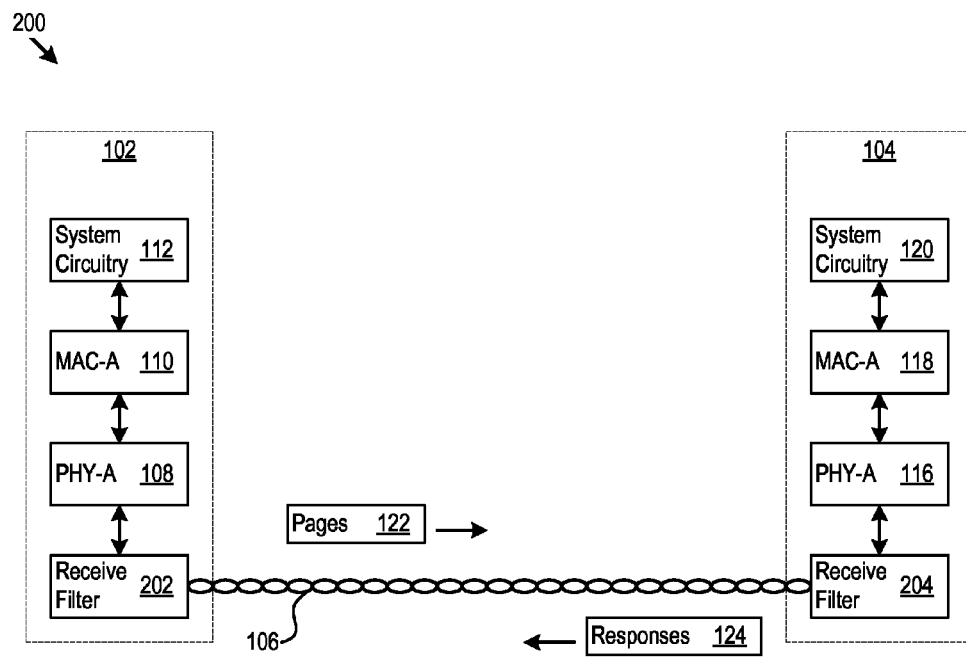
FIG. 2 is another example of two link partners in communication.

FIG. 2 is another example communication system 200, showing that the link partners typically include receivers with receive filters, e.g., the receiver filter 202 and the receiver filter 204. These filters have filter characteristics that characterize their operation, including passband, stopband, and transition characteristics between the passband and stopband.

The receiver filters 202, 204 may be high pass filters. The high pass filters may specify a relatively tight frequency response to eliminate noise that is out of the signal range. In some implementations, the filters may be inexpensive, small, light and have controlled complexity. For example, the filters may be 1-pole filters, with relatively slow frequency roll off.

Figure 3:
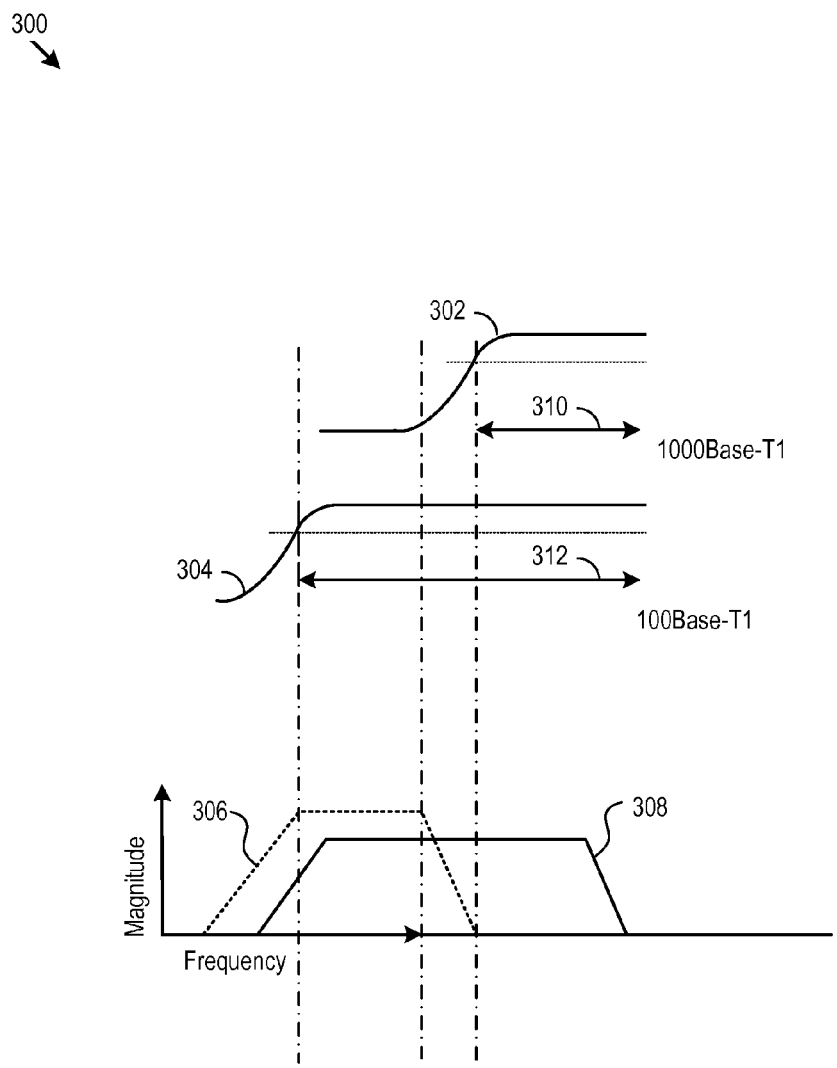
FIG. 3 shows example filter characteristics.

FIG. 3 shows example filter characteristics 300. As noted above, the link partners often vary according to the communication standard they support. The communication standards may specify disparate receive filter characteristics. For the purposes of discussion, the frequency response 302, with passband 310, is used to represent receiver filter characteristics for 1000Base-T1 and the frequency response 304, with passband 312, is used to represent receiver filter characteristics for 100Base-T1. The filter characteristics actually implemented may vary widely.

In this example, the 1000Base-T1 standard specifies a frequency range for communication signals that is centered much higher than 100Base-T1. Accordingly, the frequency response 302 starts the passband 310 at a higher frequency than the passband 312 for 100Base-T1. One consequence is that the frequency response 302 attenuates lower frequencies much sooner than the 100Base-T1 standard.

The differences in filter characteristics do not necessarily present a problem for the general purpose data signals transmitted between link partners. That is, the modulation and encoding of general purpose data signals places the frequency content of the transmitted signals where the receiver filters for multiple different communication standards may sufficiently pass the frequency content in order to recover the general purpose data. As a particular example, the modulation may be 3-level pulse amplitude modulation (PAM3), and the data bit encoding may be differential Manchester encoding (DME). Both 100Base-T1 and 1000Base-T1 receiver filters sufficiently pass the frequency content of the transmitted general purpose data signals to reliably recover the data.

The auto-negotiation process however, is not limited to communicating general purpose data. Link partners, during the auto-negotiation process, may send signals with frequency characteristics that do not align with general purpose data transmission. In particular, the link partners may send start delimiters prior to the page data that do not adhere to the nominal modulation and encoding applied to general purpose data bits.

In FIG. 3, for instance, if the spectral content 306 represents the start delimiter, then the start delimiter may pass the 100Base-T1 filter, but not the 1000Base-T1 filter. However, if the spectral content 308 represents the start delimiter, then the start delimiter may pass both the 100Base-T1 filter and the 1000Base-T1 filter because there is sufficient spectral content in both the passband 310 of the 1000Base-T1 filter and the passband 312 of the 100Base-T1 filter.

Figure 4:
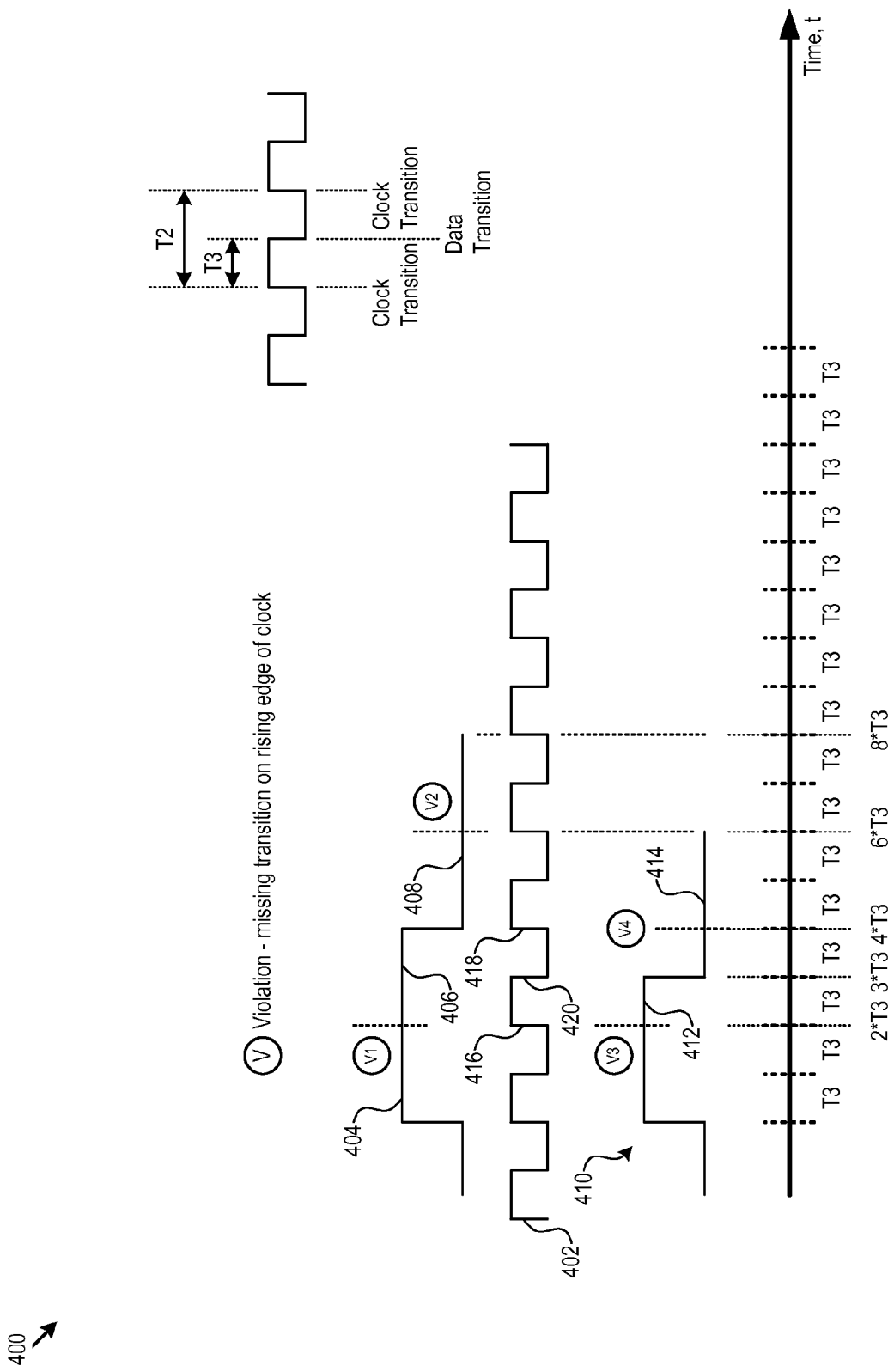
FIG. 4 shows examples of start delimiters.

FIG. 4 shows examples 400 of two different start delimiters and timing references. For the purposes of this discussion, the timing of the start delimiters is referenced to the unit of time T3. Time T3 represents a pre-defined clock-transition to data-transition time for DME, e.g., 3 ns to 3.4 ns, and nominally 3.2 ns. The data clock 402 may have a period of T2=2*T3, e.g., 6.2 ns to 6.6 ns, and nominally 6.4 ns. The nominal clock timings may vary widely depending on the implementation.

The first start delimiter 404 extends over a period of 8*T3, or 4 clocks. For the start delimiter 404, the transmitter deliberately forgoes a state transition to cause a DME violation at two places, marked V1 and V2. V1 and V2 occur in the middle (in time) of the high state 406 and the low state 408. The start delimiter 404 is defined in IEEE 802.3, clause 75.5.3.1.

The start delimiter 404, however, is an extended pulse of duration 8*T3, twice the width of a regular pulse. The extended pulse creates low frequency content. This content that may not be able to be sufficiently passed by both 100Base-T1 and 1000Base-T1 receiver filters (depending on the final characteristics for those filters) for the link partner to reliably detect the violations that signal a start delimiter.

In contrast, the second start delimiter 410 extends over a shortened period of 6*T3, or 3 T2 length clock cycles. The shortened start delimiter pulse is defined by the first section 412 (the high state) followed by the second section 414 (the low state). Each section has a beginning and an end that defines a length for the section that results in a shortened start delimiter compared to the start delimiter 404. In this example, the two sections 412 and 414 are each nominally three times the pre-defined clock-transition to data-transition time, T3, in length, and the overall length is nominally 6*T3.

The transmitter sends the shortened start delimiter 410 to signal that subsequently transmitted page data follows. The transmitter deliberately creates DME encoding violations in the start delimiter 410 for the receiver to recognize the start delimiter 410. The violations are marked V3 and V4 in FIG. 4. The violation V3 occurs at 2*T3 from the start of the first section 412, or ⅔ of the way through the first section 412. At this location, the rising edge clock transition 416 would ordinarily require a state transition for DME.

The violation V4 occurs at 1*T3 from the start of the second section 414, or ⅓ of the way through the second section 414. At this location, the rising edge clock transition 418 would ordinarily require a state transition for DME. The start delimiter 410 changes state at 3*T3, on the falling edge clock transition 420. One change of state in 6*T3 time is therefore two DME violations, and allows the receiver to detect that a start delimiter 410 has been received.

The shortened start delimiter 410 widens the frequency content in the start delimiter 410 compared to the longer start delimiter 404. As a result, the frequency spectrum in the start delimiter 410 has significant components over a wider frequency range, allowing the frequency content to sufficiently pass the receiver filters in both 100Base-T1 and 1000Base-T1 receivers. Said another way, sufficient frequency content extends above the high pass filter cutoffs for both types of receives to successfully recognize the start delimiter and the violations V3 and V4.

Figure 5:
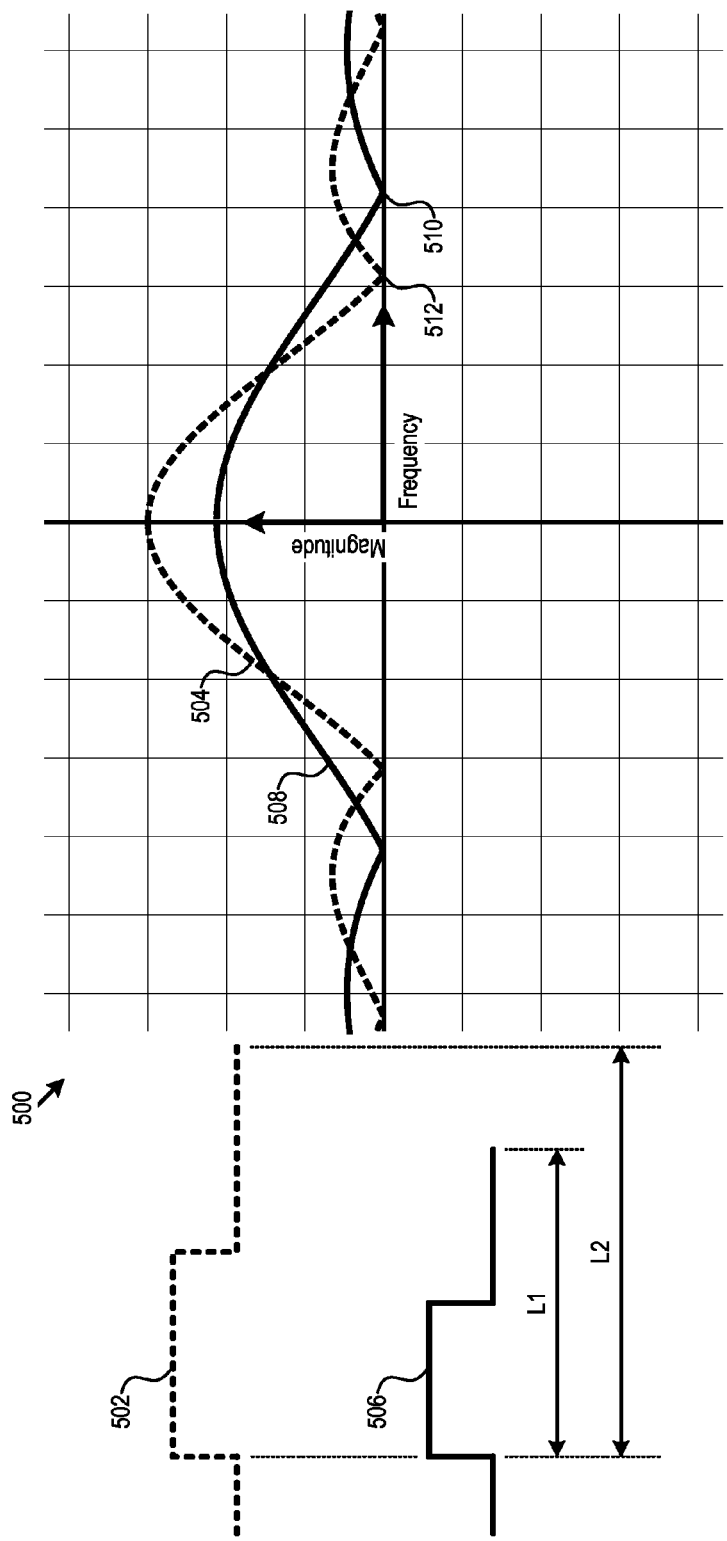
FIG. 5 shows examples of spectral content for pulses of different lengths.

FIG. 5 shows a view of the magnitude of frequency content 500 for pulses of different length L1 and L2, for reference to the discussion above concerning the extended start delimiter 404 and the shortened start delimiter 410. The longer pulse 502 has the narrower spectral content 504 and the shorter pulse 506 has the widened spectral content 508. In the particular example described in FIG. 4, the first zero 510 of the frequency content 508 for the shortened start delimiter 410 occurs at 4/3 the frequency of the first zero 512 of the longer start delimiter 404. The widened spectral content 508 contains frequency components that will pass through receiver filters at different center frequencies for different communication standards, e.g., the receiver filters for 100Base-T1 and 1000Base-T1. As a result, both types of receivers may recover the signal and recognize, e.g., encoding violations that characterize a shortened start delimiter.

Accordingly, link partners operating under either standard recognize both violations V3 and V4, and thereby recognize reception of the shortened start delimiter 410. Having recognized the shortened start delimiter 410, the receivers can prepare for and receive the page data transmitted after the shortened start delimiter 410. Furthermore, the link partners may use the shortened start delimiter 410 (and therefore a consistent auto-negotiation process) to successfully perform auto-negotiation for multiple different communication standards. In this example the communication standards are 100Base-T1 and 1000Base-T1, but the same principle may be applied to other standards, different numbers of standards, different receiver filter designs, and different start delimiter lengths and spectral content.

Figure 6:
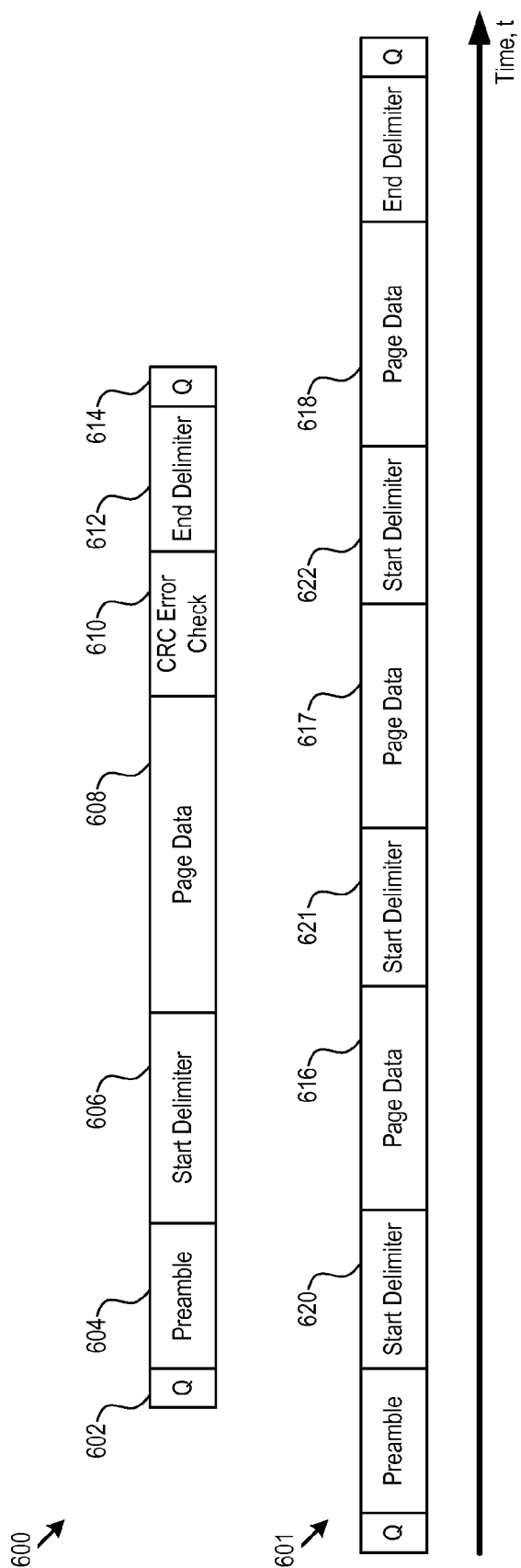
FIG. 6 shows auto-negotiation signaling.

FIG. 6 shows auto-negotiation signaling 600. In the example of FIG. 6, a period of quiet 602 is followed by an optional preamble 604. Quiet may be defined in different ways, e.g., as a signal amplitude of magnitude less than 50 mV. The preamble 604 may be transmitted to, for instance, allow the transmitter to settle prior to sending data. The preamble 604 may vary in content and in extent, e.g., four, eight, or some other number 'n' of pulses of width T2. The preamble 604 helps the receiver recover the clock by determining where the clock boundaries exist.

The shortened start delimiter 606 follows the preamble 604, and the page data 608 follows the shortened start delimiter 606. As just one example, the page data 608 may be a 48 bit PAM3 modulated DME encoded field. The page data 608 conveys link partner capabilities to receiving devices.

An optional error checking code 610 may also be provided, e.g., before or after the page data 608. In one implementation, the error checking code 610 is an 8-bit CRC code computed over the page data 608. However, other error checking codes may be used. An end delimiter 612 signals the end of the auto-negotiation signaling 600, and may take the same form as the shortened start delimiter 606 (as one example), but may also take other forms different from the shortened start delimiter 606. As noted above, the communication link 106 may be a single twisted pair, over which the link partners take turns transmitting and receiving. The end delimiter 612 signals the end of an auto-negotiation transmission, permitting the link partner to better judge when it may take its turn transmitting. Quiet time 614 may follow the end delimiter 612.

The auto-negotiation signaling 600 may vary in implementation. FIG. 6 shows a second example 601 in which the transmitter sends multiple repetitions of page data 616, 617, and 618, each preceded by a start delimiter 620, 621, and 622. In this example, the CRC error check is omitted. The receiver may determine that the page data is received correctly when all sets of page data 616, 617, 618 agree. In other implementations, the transmitter sends 2, 4 (or more) repetitions of page data, and the receiver may determine that the page data is received correctly when all repetitions agree, the majority of repetitions agree, or when some other pre-defined correctness test is met.

Figure 7:
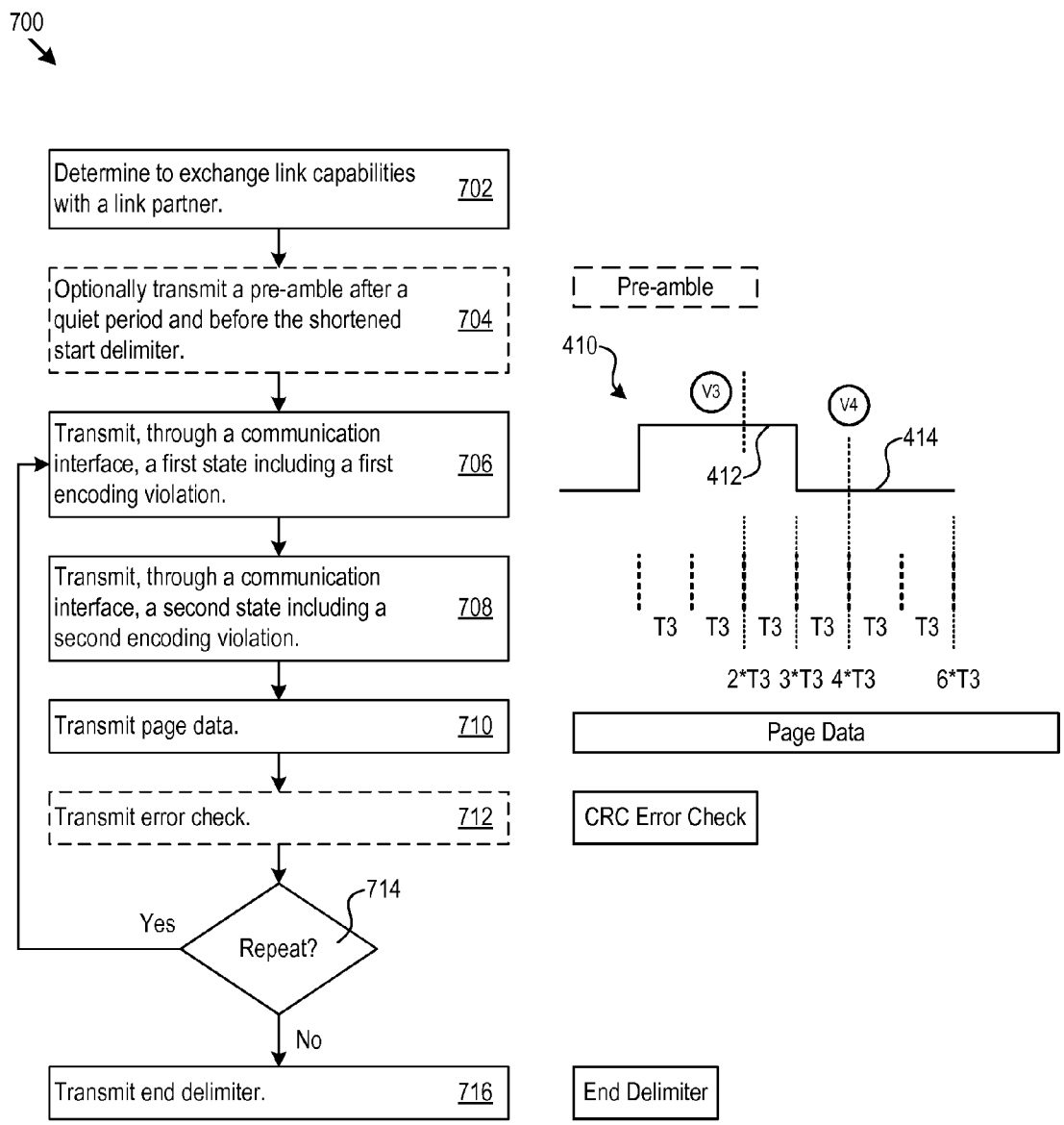
FIG. 7 shows logic for auto-negotiation signaling by a transmitter.
Figure 8:
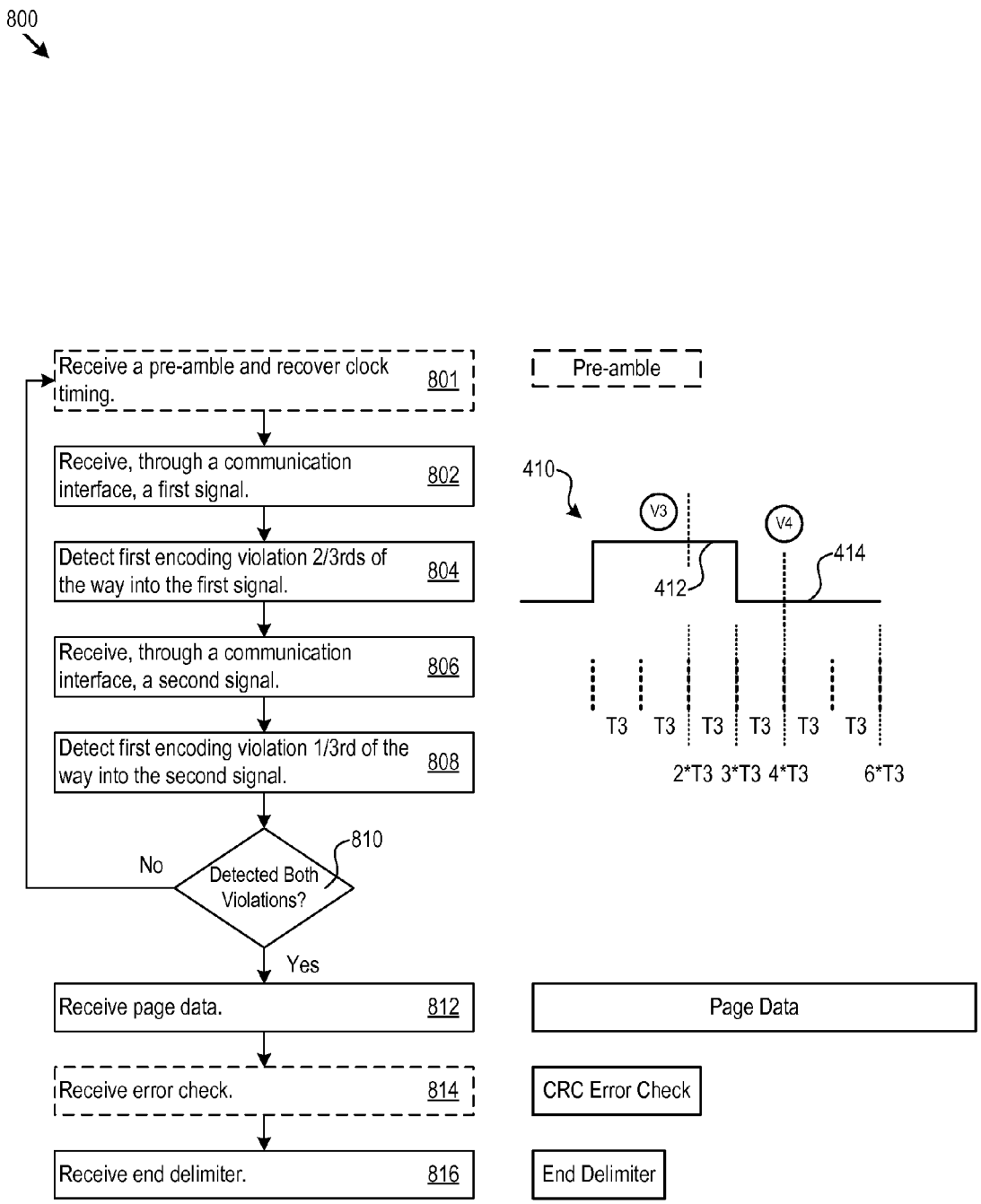
FIG. 8 shows logic for auto-negotiation signaling by a receiver.

FIG. 7 shows logic 700 for auto-negotiation signaling by a transmitter. FIG. 8 shows logic 800 for auto-negotiation signaling by a receiver. Expressed with regard to FIGS. 7 and 8, and in a different way than described above, a system such as a transmitter may include a communication interface operable to communicate with both a first receiver according to a first communication standard (e.g., 100Base-T1) and a second receiver according to a second communication standard that is different than the first communication standard (e.g., 1000Base-T1). The transmitter determines when to exchange link capabilities with a link partner (702) via auto-negotiation page data, and in response optionally transmits, through the communication interface, a pre-amble (704) and a shortened start delimiter 410 prior to the page data.

The shortened start delimiter 410 includes a first section 412 with a first encoding violation (704), with a transition to a second section 414 that includes a second encoding violation (706). The first section, followed by the second section, together define a start delimiter length (e.g., 6*T3) adapted to control spectral content for the start delimiter. The spectral content passes sufficiently through a first receiver filter for the first receiver, to allow the first receiver to detect the first encoding violation and the second encoding violation. The spectral content also passes sufficiently through a second receiver filter for the second receiver, to allow the second receiver to detect the first encoding violation and the second encoding violation.

The transmitter follows the start delimiter with the page data (710) and, optionally error checking data, such as a CRC over the page data (712). The transmitter may repeat (714) start delimiters, page data, and error checking data as many times as desired. An end delimiter followed by quiet time may end the auto-negotiation signaling (716).

A system such as a receiver may include a communication interface operable to communicate with a link partner. The receiver optionally receives a pre-amble and may recover clock timing from the pre-amble (801). The receiver then receives, from the link partner, a first signal (e.g., the section 412) (802). The receiver detects that the first signal includes a first encoding violation (804), e.g., nominally two-thirds of the way through the first signal.

The receiver also receives, from the link partner, a second signal (e.g., the section 414) (806) immediately following the first signal. The receiver detects that the second signal includes a second encoding violation (808), e.g., nominally one-third of the way through the second signal. In response to detecting the first encoding violation and the second encoding violation, the receiver determines that the first signal followed by the second signal defines a start delimiter for auto-negotiation page data that will follow the start delimiter (810). In other implementations, the receiver may determine that it has found a start delimiter when only one of the two encoding violations is found, and use recovered clock timing (e.g., from the pre-amble characters) to determine when the page data starts.

Having detected the start delimiter, the receiver may then receive the following page data (812) and any optional error check data (814). An end delimiter follows the error check data (816). In other implementations in which multiple repetitions are transmitted, the receiver may receive the multiple repetitions of start delimiters, page data, and error check data, and determine whether the page data meets a reliability test (e.g., reception of 3 duplicate sets of page data) before responding to the link partner with an acknowledge and with its own link capabilities.

The methods, devices, processing, and logic described above may be implemented in many different ways and in many different combinations of hardware and software. For example, all or parts of the implementations may be circuitry that includes an instruction processor, such as a Central Processing Unit (CPU), microcontroller, or a microprocessor; an Application Specific Integrated Circuit (ASIC), Programmable Logic Device (PLD), or Field Programmable Gate Array (FPGA); or circuitry that includes discrete logic or other circuit components, including analog circuit components, digital circuit components or both; or any combination thereof. The circuitry may include discrete interconnected hardware components and/or may be combined on a single integrated circuit die, distributed among multiple integrated circuit dies, or implemented in a Multiple Chip Module (MCM) of multiple integrated circuit dies in a common package, as examples.

The circuitry may further include or access instructions for execution by the circuitry. The instructions may be stored in a tangible storage medium that is other than a transitory signal, such as a flash memory, a Random Access Memory (RAM), a Read Only Memory (ROM), an Erasable Programmable Read Only Memory (EPROM); or on a magnetic or optical disc, such as a Compact Disc Read Only Memory (CDROM), Hard Disk Drive (HDD), or other magnetic or optical disk; or in or on another machine-readable medium. A product, such as a computer program product, may include a storage medium and instructions stored in or on the medium, and the instructions when executed by the circuitry in a device may cause the device to implement any of the processing described above or illustrated in the drawings.

The implementations may be distributed as circuitry among multiple system components, such as among multiple processors and memories, optionally including multiple distributed processing systems. Parameters, databases, and other data structures may be separately stored and managed, may be incorporated into a single memory or database, may be logically and physically organized in many different ways, and may be implemented in many different ways, including as data structures such as linked lists, hash tables, arrays, records, objects, or implicit storage mechanisms.

Programs may be parts (e.g., subroutines) of a single program, separate programs, distributed across several memories and processors, or implemented in many different ways, such as in a library, such as a shared library (e.g., a Dynamic Link Library (DLL)). The DLL, for example, may store instructions that perform any of the processing described above or illustrated in the drawings, when executed by the circuitry.

Various implementations have been specifically described. However, many other implementations are also possible.

What is claimed is:

1. A system comprising:
a communication interface operable to communicate with:
a first receiver according to a first communication standard; and
a second receiver according to a second communication standard that is different than the first communication standard; and
a transmitter coupled with the communication interface, the transmitter configured to:
determine to start an auto-negotiation page; and
transmit, through the communication interface, a start delimiter prior to the auto-negotiation page, the start delimiter comprising:
a first section comprising a first encoding violation, followed by:
a second section comprising a second encoding violation, where:
the first section followed by the second section define a start delimiter length adapted to create spectral content for the start delimiter that:
passes sufficiently through a first receiver filter for the first receiver, to allow the first receiver to detect the first encoding violation and the second encoding violation; and
passes sufficiently through a second receiver filter for the second receiver, to allow the second receiver to detect the first encoding violation and the second encoding violation.

2. The system of claim 1, where:
the first encoding violation comprises a differential Manchester encoding violation.

3. The system of claim 2, where:
the first section is characterized by a beginning and an end that defines a length that is nominally three times a pre-defined clock-transition to data-transition time.

4. The system of claim 3, where:
the first encoding violation nominally occurs at twice the clock-transition to data-transition time from the beginning.

5. The system of claim 4, where:
the differential Manchester encoding violation is defined relative to a data clock that has a nominal period of twice the pre-defined clock-transition to data-transition time.

6. The system of claim 1, where:
the second encoding violation comprises a differential Manchester encoding violation.

7. The system of claim 6, where:
the second section is characterized by a beginning and an end that defines a length that is nominally three times a pre-defined clock-transition to data-transition time.

8. The system of claim 7, where:
the second encoding violation nominally occurs at the clock-transition to data-transition time from the beginning.

9. The system of claim 8, where:
the differential Manchester encoding violation is defined relative to a data clock that has a nominal period of twice the pre-defined clock-transition to data-transition time.

10. The system of claim 1, where the transmitter is further configured to:
transmit a pre-amble prior to the start delimiter.

11. The system of claim 1, where the transmitter is further configured to:
transmit an error checking code after the auto-negotiation page.

12. The system of claim 11, where the error checking code comprises:
a cyclic redundancy check (CRC) code.

13. A method comprising:
determining to exchange link capabilities with a link partner that has initially unknown receiver filter characteristics;
transmitting, through a communication interface, a start delimiter prior to the exchange of link capabilities, the start delimiter comprising:
a first state comprising a first encoding violation, followed by:
a transition to a second state opposite that of the first state, the second state comprising a second encoding violation, where:
the first state followed by the second state defines a start delimiter length adapted to create frequency content for the start delimiter that:
passes sufficiently through a first predefined receiver filter response possible for the link partner, to allow the link partner to detect the first encoding violation and the second encoding violation when the link partner adheres to the first predefined receiver filter response; and
passes sufficiently through a second predefined receiver filter response possible for the link partner, to allow the link partner to detect the first encoding violation and the second encoding violation when the link partner adheres to the second predefined receiver filter response.

14. The method of claim 13, where:
the first encoding violation comprises a differential Manchester encoding violation;
the first state is characterized by a beginning and an end that defines a length that is nominally three times a pre-defined clock-transition to data-transition time; and
the first encoding violation nominally occurs at twice the clock-transition to data-transition time from the beginning.

15. The method of claim 14, where:
the differential Manchester encoding violation is defined relative to a data clock that has a nominal period of twice the pre-defined clock-transition to data-transition time.

16. The method of claim 13, where:
the second encoding violation comprises a differential Manchester encoding violation;
the second state is characterized by a beginning and an end that defines a length that is nominally three times a pre-defined clock-transition to data-transition time; and the second encoding violation nominally occurs at the clock-transition to data-transition time from the beginning.

17. The method of claim 16, where:
the differential Manchester encoding violation is defined relative to a data clock that has a nominal period of twice the pre-defined clock-transition to data-transition time.

18. The method of claim 13, further comprising:
transmitting auto-negotiation page data after the start delimiter;
transmitting a cyclic redundancy check (CRC) code after the auto-negotiation page; and
transmitting a pre-amble prior to the start delimiter.

19. A system comprising:
a communication interface operable to communicate with a link partner; and
a receiver coupled with the communication interface, the receiver configured to:
receive, from the link partner, a first signal;
detect that the first signal comprises a first encoding violation nominally two-thirds through the first signal;
receive, from the link partner, a second signal immediately following the first signal;
detect that the second signal comprises a second encoding violation nominally one-third through the second signal; and
determine, responsive to detecting the first encoding violation and the second encoding violation, that the first signal followed by the second signal defines a start delimiter for an auto-negotiation page that will follow the start delimiter.

20. The system of claim 19, where:
the first encoding violation comprises a first differential Manchester encoding violation;
the first signal is characterized by a beginning and an end that defines a signal length that is nominally three times a pre-defined clock-transition to data-transition time;
the second encoding violation comprises a second, different, differential Manchester encoding violation; and
the second signal extends for the same signal length as the first signal.

* * * * *